United States Patent
Wang (10) Patent No.: US 8,067,883 B2
(45) Date of Patent: Nov. 29, 2011

(54) FRIT SEALING OF LARGE DEVICE

(75) Inventor: Wenchao Wang, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 585 days.

(21) Appl. No.: 12/074,156

(22) Filed: Feb. 29, 2008

(65) Prior Publication Data

US 2009/0218932 A1  Sep. 3, 2009

(51) Int. Cl.
- *H01J 1/88* (2006.01)
- *H01J 19/42* (2006.01)
- *H01K 1/18* (2006.01)

(52) U.S. Cl. .................... 313/292; 313/498; 313/506

(58) Field of Classification Search .......... 313/498–512, 313/495, 582, 292
See application file for complete search history.

(56) References Cited

U.S. PATENT DOCUMENTS

| | | | |
|---|---|---|---|
| 3,582,978 A | 6/1971 | Petersen et al. | 313/64 |
| 3,590,468 A | 7/1971 | Buck | 29/473.1 |
| 3,807,833 A | 4/1974 | Graham et al. | 350/160 |
| 4,221,604 A | 9/1980 | Chirino et al. | 106/286.5 |
| 4,289,538 A | 9/1981 | Orso | 106/286.5 |
| 4,293,325 A | 10/1981 | Chirino et al. | 65/43 |
| 4,676,817 A | 6/1987 | Tailor et al. | 65/43 |
| 5,490,323 A | 2/1996 | Thacker et al. | 29/625 |
| 6,058,782 A | 5/2000 | Kurtz et al. | 73/727 |
| 6,825,429 B2 | 11/2004 | Dove et al. | 200/302 |
| 6,831,404 B2 | 12/2004 | Dunham et al. | 313/495 |
| 6,998,776 B2 | 2/2006 | Aitken et al. | 313/512 |
| 7,282,393 B2 | 10/2007 | Tarn | 438/116 |
| 2005/0003263 A1 | 1/2005 | Mallari et al. | 429/44 |
| 2005/0157374 A1* | 7/2005 | Tarn | 359/291 |
| 2005/0208865 A1 | 9/2005 | Kotter et al. | 445/25 |
| 2006/0009109 A1 | 1/2006 | Aitken et al. | 445/24 |
| 2007/0096631 A1 | 5/2007 | Sung et al. | 313/498 |
| 2007/0170845 A1* | 7/2007 | Choi et al. | 313/504 |
| 2007/0170861 A1* | 7/2007 | Lee et al. | 313/512 |
| 2007/0216304 A1* | 9/2007 | Kwon et al. | 313/582 |
| 2007/0232182 A1* | 10/2007 | Park | 445/25 |
| 2008/0106194 A1* | 5/2008 | Logunov et al. | 313/512 |
| 2008/0239637 A1* | 10/2008 | Sung et al. | 361/681 |

FOREIGN PATENT DOCUMENTS

| | | |
|---|---|---|
| JP | 2000-143262 | 5/2000 |
| KR | 10-0671647 | 1/2006 |
| KR | 10-2008-0002396 | 1/2008 |

* cited by examiner

*Primary Examiner* — Joseph L Williams
*Assistant Examiner* — Kevin Quarterman
(74) *Attorney, Agent, or Firm* — Siwen Chen

(57) ABSTRACT

A hermetically sealed device comprising a spacing unit and a resistive heating element desirably having a closed-loop structure and process for hermetically sealing a device by using such heating element and spacing unit. The frit can form multiple closed-loops to prevent crack propagation. The heating element can be advantageously made of a metal such as Invar® and/or Kovar®. The invention enables hermetic frit sealing with low residual stress in the seal for large-area displays. The invention is particularly advantageous for hermetic sealing of OLED display devices having a large area, such as those above 10 inches (25 cm).

12 Claims, 4 Drawing Sheets

FRIT SEALING OF LARGE DEVICE

TECHNICAL FIELD

The present invention relates to sealing of devices using frit material. In particular, the present invention relates to hermetic sealing of a device having a chamber using direct resistive heating of frit materials and devices thus sealed. The present invention is useful, e.g., in the sealing of large OLED devices.

BACKGROUND

Many optical and/or electrical devices comprise a chamber defined by multiple components, with additional optical and/or electronic elements housed and protected inside the chamber. Hermetic sealing of such chambers of such devices may be desired depending on the included components to extend the life span of the device. Hermetic sealing can be a challenge.

For example, OLED (organic light-emitting diode) display is on the horizon of next generation display market, but hermetic sealing technology becomes one of the hurdles for its commercialization. The diodes are in general very sensitive to oxygen and moisture. Thus hermetic sealing is required for the chamber housing them. Various frit sealing methods have been developed to join and seal glass plates to form such hermetic chambers. One exemplary method utilizes electromagnetic irradiation, such as an infrared laser beam, to heat and soften the frit material to achieve the hermetic sealing.

Another method involves direct resistive heating of the frit materials to achieve a bonding of the components to be sealed together. United States Patent Application Publication Serial No. 2007/0096631 and U.S. Pat. No. 7,282,393 disclose direct resistive heating of frit materials to join two substrates. However, the direct resistive heating approaches as disclosed therein suffer from various drawbacks and need improvement. One of the drawbacks is non-uniform heating of the frit material between the substrates, which can lead to stress and crack formation in the seal, and possibly delamination.

Frit sealing of devices having an enclosure with a large area, such as flat panel TV based on OLED display, poses significant technical challenges. Traditional frit sealing using a layer of frit material between the large base substrate and the cover substrate as the bonding agent and the physical spacing component cannot be used effectively for such large sizes. The bonding strength and the separation can both fall short. Sagging of the glass substrates can cause unwanted contact between the cover plate and the substrate bearing electronic components.

The present invention provides a direct resistive heating method capable of achieving a robust hermetic sealing for large size devices.

SUMMARY

A first aspect of the present invention relates to a device comprising:
(I) a first substrate;
(II) a closed-loop-shaped inorganic spacing unit hermetically bonded to the first substrate;
(III) a resistive-heating element hermetically bonded to the spacing unit, having An electrically closed-loop structure and a shape substantially corresponding to the spacing unit.

In certain embodiments of the first aspect of the present invention, the device comprises multiple closed-loop-shaped spacing units hermetically bonded to the first substrate.

In certain embodiments of the first aspect of the present invention, the spacing unit has a height of from 0.3 to 20 mm, in certain embodiments from 0.5 to 20 mm, in certain other embodiments from 0.5 to 15 mm, in certain embodiments from 0.5 to 10 mm, in certain embodiments from 0.5 to 5 mm.

In certain embodiments of the first aspect of the present invention, the spacing unit and the resistive-heating element are bonded via a frit material. In certain embodiments, the frit material between the resistive-heating element and the spacing unit form multiple closed loops.

In certain embodiments of the first aspect of the present invention, the device further comprises:
(IV) a first layer of frit material bonded to the resistive-heating element over the surface of the resistive-heating element farther from the first substrate.

In certain embodiments of the first aspect of the present invention, the device further comprises:
(V) a second substrate bonded to the first layer of frit material.

In certain embodiments of the first aspect of the present invention, the first substrate and the second substrate are made of glass materials.

In certain embodiments of the first aspect of the present invention, the spacing unit is made of a material selected from a glass and a glass-ceramic.

In certain embodiments of the first aspect of the present invention comprising the first layer of frit material, the first layer of frit material form multiple closed loops.

In certain embodiments of the first aspect of the present invention, between the first substrate and the second substrate, a hermetically sealed enclosure is defined.

In certain embodiments of the first aspect of the present invention, the device comprises electronic elements housed inside the enclosure. In certain embodiments, the electronic elements comprise an organic electroluminescent material.

In certain embodiments of the first aspect of the present invention, the stress of the bonding between the first layer of frit material and the second substrate is substantially uniform.

In certain embodiments of the first aspect of the present invention, the resistive heating element has an average thickness from 0.025 to 2.5 mm.

In certain embodiments of the first aspect of the present invention, the resistive heating element has a substantially uniform thickness and width, except in the lead area.

In certain embodiments of the first aspect of the present invention, the device further comprises:
(VI) a second layer of frit material between the first substrate and the spacing unit.

In certain embodiments of the first aspect of the present invention, the first layer of frit material and the second layer of frit material consist essentially of the same frit material.

In certain embodiments of the first aspect of the present invention, the resistive heating element comprises a metal selected from Ni—Fe alloys and Ni—Co—Fe alloys such as Invar® and Kovar®.

In certain embodiments of the first aspect of the present invention, the resistive heating element comprises electrical leads arranged such that when an electrical potential gradient is applied to the leads, the current density passing through the loop is substantially uniform.

In certain embodiments of the first aspect of the present invention, the first layer of frit material has an average thickness of 0.005 to 0.5 mm; and the second layer of frit material has an average thickness of 0.005 to 0.5 mm.

In certain embodiments of the first aspect of the present invention, the device has a diagonal size of the sealed area larger than 10 inches (25 cm), in certain embodiments larger than 20 inches (50 cm), in certain other embodiments larger than 30 inches (75 cm).

A second aspect of the present invention is a method for forming a hermetical enclosure between a first substrate and a second substrate, comprising:

(A) providing the first substrate and the second substrate;

(B) hermetically bonding a closed-loop-shaped spacing unit to a surface of the first substrate;

(C) providing a second layer of frit material over a surface of the spacing unit;

(D) providing a resistive-heating element, having a shape substantially corresponding to that of the spacing unit and a closed-loop structure, in direct contact with the second layer of frit material;

(E) providing a first layer of frit material over the surface of the resistive heating element distal from the first substrate;

(F) contacting the first layer of frit material with a surface of the second substrate; and (G) passing an electric current through the resistive heating element to heat and soften the layers of frit materials, to effect a hermetic bonding between the layers of frit materials, the resistive heating element and the substrates.

In certain embodiments of the method according to the second aspect of the present invention, in step (C), the resistive heating element consists essentially of a metal selected from Ni—Fe alloys and Ni—Co—Fe alloys such as Invar® and Kovar® and combinations thereof.

In certain embodiments of the method according to the second aspect of the present invention, in step (C), the resistive heating element are configured to have electrical leads arranged such that in step (F), the current density passing through the resistive heating element is substantially uniform.

In certain embodiments of the method according to the second aspect of the present invention, in step (B), multiple spacing units are bonded to the surface of the first substrate.

In certain embodiments of the method according to the second aspect of the present invention, before step (C) is carried out, the first layer and the second layer of frit materials are applied to two opposite surfaces of the resistive heating element.

In certain embodiments of the method according to the second aspect of the present invention, the first layer of frit material forms multiple closed loops over the surface of the resistive-heating element.

In certain embodiments of the method according to the second aspect of the present invention, the second layer of frit material forms multiple closed loops between the resistive-heating element and the spacing unit.

A third aspect of the present invention is a device comprising:

(I) a first substrate;

(II) a closed-loop-shaped inorganic spacing unit hermetically bonded to the first substrate;

(III) a resistive-heating element having a shape substantially corresponding to the spacing unit; and (IV) a first layer of frit material bonded to the resistive-heating element over the surface of the resistive-heating element farther from the first substrate forming multiple closed loops.

In certain embodiments of the third aspect of the present invention, the resistive-heating element has an electrically closed-loop structure.

One or more embodiments of the present invention have one or more of the following advantages. First, a simple process with good quality control can be achieved by using frit-coated resistive element. Second, the sealing temperature is measurable and sealing parameters can be fine-tuned. With resistive heating method, the resistor temperature can be measured by various techniques, such as infrared imaging. Third, by using a resistive heating element having a closed loop structure, improved uniformity of temperature distribution along the frit line can be achieved. Along with the more uniform temperature distribution is less residual stress, thus a robust seal.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that the foregoing general description and the following detailed description are merely exemplary of the invention, and are intended to provide an overview or framework to understanding the nature and character of the invention as it is claimed.

The accompanying drawings are included to provide a further understanding of the invention, and are incorporated in and constitute a part of this specification.

DETAILED DESCRIPTION

Unless otherwise indicated, all numbers such as those expressing weight percents of ingredients, dimensions, and values for certain physical properties used in the specification and claims are to be understood as being modified in all instances by the term "about." It should also be understood that the precise numerical values used in the specification and claims form additional embodiments of the invention. Efforts have been made to ensure the accuracy of the numerical values disclosed in the Examples. Any measured numerical value, however, can inherently contain certain errors resulting from the standard deviation found in its respective measuring technique.

As used herein, in describing and claiming the present invention, the use of the indefinite article "a" or "an" means "at least one," and should not be limited to "only one" unless explicitly indicated to the contrary. Thus, for example, reference to "a layer of frit material" includes embodiments having two or more such layers of the same or differing composition, unless the context clearly indicates otherwise.

The term "CTE" means coefficient of thermal expansion.

Many devices, including but not limited to opto-electronic devices, require a hermetically sealed housing to protect components sensitive to the atmospheric environment. Organic light-emitting diodes ("OLED") are based on organic materials the performance of which can be severely affected by oxygen and moisture in the air. Therefore, typical display devices comprising OLED components require the organic electronics be hermetically sealed. One sealing approach involves the formation of a hermetic housing enclosing the electronics between two glass substrates: a base substrate on which the electronics are formed, and a cover substrate covering the electronics. The present invention is useful for hermetically sealing OLED devices by forming such hermetic housing. The following detailed description of the present invention is given in the context of the sealing of OLED devices. However, one having ordinary skill in the art can and should understand that the present invention can be utilized to form hermetic enclosure for other applications other than OLEDs. The present invention may be used for forming a non-hermetic seal in various devices as well.

As OLED (organic light-emitting diode) technology becomes more and more mature, the size of the displays are growing from several inches to 10-20 inches (25-50 cm), and will grow even larger. Some technical issues of scaling up the frit sealing to such large sizes include:

Seal width—In order to achieve adequate bonding strength, the frit line width needs to be scaled up to over 10 mm. Hermetic sealing using infrared light beam for such width is challenging.

Seal height—Larger displays require bigger space between cover and substrate glasses for compensating glass sag and distortion. If frit material is used as the only spacing media between the large substrates, increased thickness would be necessary, which could cause fatal problems because frit itself has fairly poor mechanical properties in terms of strength and toughness. Building a higher "frit wall" can cause problems, such as frit cracking and delamination.

Seal strength—Frit seal is fragile. Improper handling of sealed devices can cause frit cracking. This issue will be much more serious for displays large than 10" than for 1" to 3" displays because larger displays can be much easier to bend and/or distorted. So designing a stronger and tougher seal is essential for successfully sealing large OLED displays.

This invention is to provide a stronger and tougher seal by using a new design that employs a spacing unit ring as desired spacing "wall". The invention allows for the use of a thinner but elaborately designed frit pattern as sealant. The spacing unit is sealed on both sides, providing a hermetic seal for large OLED displays.

The present invention also employs direct resistive-heating to seal the device.

Figure 1:
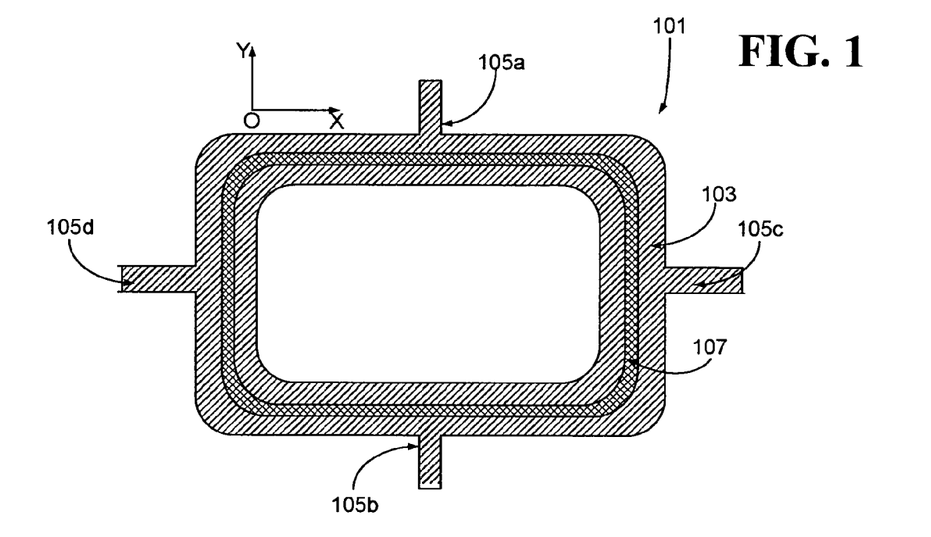
FIG. 1 is a schematic illustration of the resistive heating element bearing one closed-loop of frit material on one surface thereof according to one embodiment of the present invention.
Figure 2:
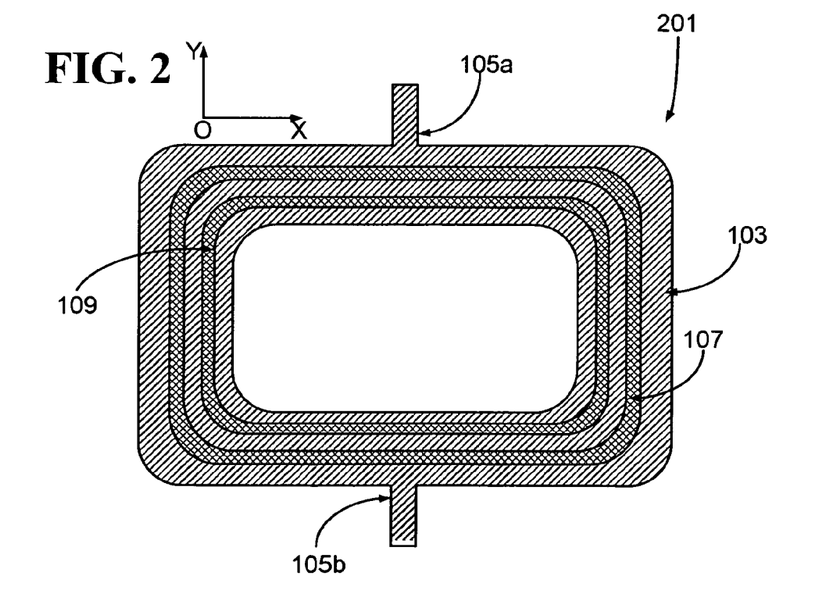
FIG. 2 is a schematic illustration of the resistive heating element bearing two closed loops of frit material on one surface thereof according to another embodiment of the present invention.

FIGS. 1 and 2 schematically illustrate the top view of the resistive-heating elements 101 and 201 according to certain embodiments of the device of the present invention. The resistive-heating elements have a closed-loop structure 103 having electrical leads 105a, 105b, 105c and 105d. By "closed-loop structure" is meant that when an electrical potential gradient is applied between two electrical leads, an electric current will pass through the whole loop such that the whole loop is heated ohmically, and the two sides between the two leads function as two parallel-connected resistors. Thus, for example, a closed-loop structure can take the shape of a closed rectangle, a closed circle, or any other desired closed shape. In certain embodiments, it is desirable that the closed-loop structure is symmetrical relative to a straight line connecting the center of two opposite electrical leads. The closed-loop structure has the advantage of leaving essentially no gap that is not heated by the passing current, thereby resulting in a substantially uniform heating of the frit materials bonded thereto and a more robust bonding between the heating element and other components to be joined. It is highly desired that when an electric current passes through the heating element, the temperature throughout the loop increases at essentially the same rate. To that end, in certain embodiments it is highly desired that the loop of the heating element has an essentially uniform width and thickness, and the length of the two parts of the heating element between two opposite electrical leads are essentially the same, such that the current density in the loop is essentially uniform, resulting in uniform thermal energy released throughout the loop. The exemplary heating elements illustrated in FIGS. 1 and 2 show only a single closed loop in the structure. However, it is possible, and in certain embodiments desirable, that the heating elements has a structure comprising multiple closed-loops. A multiple closed-loop structure allows for the sealing and formation of multiple compartments at the same time.

The thickness of the heating element can be determined according to several factors, inter alia: the distance required between the OLED substrates to be bonded together; the thickness of the frit layers, and the method for forming the heating elements. The thickness of the heating element can range from 0.025 to 0.25 mm, in certain embodiments from 0.05 to 2.5 mm, in certain embodiments from 0.1 to 2.5 mm, in certain embodiments from 0.2 to 2.0 mm.

The heating elements can be formed by, e.g., chemical vapor deposition, sputtering, screen printing, and other thin film processes. The heating element can be made of, e.g., metals and alloys, electrically conducive oxides, semiconductor materials, and combinations thereof. Examples of materials suitable for thin film processes include, but are not limited to: $SnO_2$, $SiC$, $MoS_2$. Thin film processes can be used to deposit the heating element with highly controllable dimensions and compositions.

In certain particularly advantageous embodiments, the heating element is made from a thin sheet of conductive material, such as metal foils by, e.g., dicing, cutting, etching (such as photolithography processes), and the like. Particularly advantageous metal foils in certain embodiments include those made of Al, Ag, Au, Cu, and the like. Factors deciding the metal choice can include, inter alia: (i) CTE match between the metal, the frit material to be bonded with the metal, and the CTE match between the metal and the spacing unit to be bonded. Certain metal alloys have CTE close to certain inorganic frit material and are thus highly desired for the present invention. For example, nickel-steel alloys (such as those having a trade name Invar®) and nickel-cobalt-ferrous alloys (such as those having a trade name Kovar®) can be purchased in foil or sheet form having differing thickness and a CTE matching that of a borosilicate glass. The composition of one Kovar® alloy is 29% nickel, 17% cobalt, 0.2% silicon, 0.3% manganese, and 53.5% iron (by weight). Such low CTE metal alloys are highly advantageous for the resistive-heating element in the device of the present invention. Such metal alloy sheets can be purchased, diced in a metal shop into desired geometry, with or without a thickness-reducing step, to form the resistive-heating element useful for the present invention. Diced and etched heating elements having desired patterns can be produced in large quantity from metal foils. Another advantage of Invar® and Kovar® is the capability of being handled by magnets, including permanent and electromagnets. Therefore, even loops having large dimensions which are thin and flexible can be handled with ease. It also has been found that pre-oxidizing the metal heating element can be advantageous in certain embodiments, increasing the wetting capability of the heating element to the molten frit material. This is especially true where Kovar® is used as the metal for the heating element. Oxidization of the metal can be effected by pre-heating the element in an atmosphere comprising oxygen by, e.g., passing an electric current through the metal, or by heating it in an oven.

Figure 3:
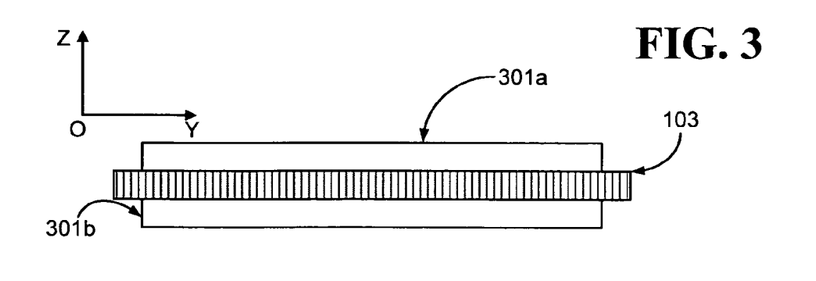
FIG. 3 is a schematic illustration of a resistive heating element having frit material coated on both sides for use according to various embodiments of the present invention.

A metal sheet may be coated with the frit material before being cut into the heating element. Alternatively, a resistive-heating element loop may be formed first, and subsequently coated with frit materials on a single or both sides before being affixed to a spacing unit or a substrate. In certain embodiments, it is particularly advantageous to coat a layer of frit material on both sides of the heating element. Doing so could eliminate the need of pre-application of a loop of frit material on the spacing unit, and the alignment between the heating element and the pre-applied frit loop. FIG. 3 illustrates a heating element having two layers of frit materials 301a and 301b applied on the two major surfaces.

In certain embodiments, it is particularly advantageous to form multiple frit loops on one or both surfaces of the heating element, such that each loop forms a hermetic bond with the spacing unit or the substrate surface. It is known that crack formed in a frit layer can propagate a continuous frit layer, leading to loss of hermeticity of the seal. The formation of multiple closed loops can avoid the propagation of crack from one loop to another, thereby potentially improving the yield of the sealed devices on the production line and extending the service life of a sealed device. FIG. 1 illustrates a heating element 101 bearing a single frit loop 107. FIG. 2 illustrates a heating element 201 bearing two frit loops 107 and 109. The third aspect of the present invention relates to a device comprising a heating element and multiple closed-loops of frit material. Although it is advantageous to have a closed-loop heating element, such closed-loop structure of the heating element is not required for the third aspect of the present invention due to the enhanced sealing capability of multiple frit rings in the structure.

The frit material useful for the present invention can be any type of frit material, as long as it is capable of being softened upon being heated to a temperature acceptable for the substrates to be sealed to provide a desirable sealing with the desired quality. Thus, the frit material can be a devitrifying frit glass material or a non-devitrifying glass material. A devitrifying frit glass material devitrifies when softened and cooled down, while non-devitrifying frit glass material remains glassy after sealing. The frit material does not have to be infrared-absorbing, albeit typical infrared-absorbing frit material may be used. The frit material comprises a glass phase which softens and provides the rheology needed for the seal when heated to the sealing temperature. In addition, the frit material may comprise a filler material which modifies the CTE and/or other physical properties. Exemplary frit materials include but are not limited to those belonging to the $ZnO-B_2O_3-SiO_2$, $SnO-ZnO-P_2O_5$ families. U.S. Pat. Nos. 7,214,441, 6,737,375 and 6,291,092 disclose various categories of frit materials, the relevant parts thereof are incorporated herein by reference.

The frit material may be applied to the heating element or to the area of the substrate surface or the surface of the spacing unit to be bonded. In certain embodiments, the frit material is applied to the surface of the heating element before bonding the heating element to the substrate surface. This approach eliminates the issue of aligning a pre-formed frit line on a substrate with the heating element. In certain other embodiments, frit materials are pre-formed on a surface of a substrate or a surface of a spacing unit, and the heating element is subsequently placed on the frit line, and allowed to bond to the surface via the frit material.

The application of the frit material to the surface of the substrate or to the surface of the heating element can be done using any method known in the art. For example, a frit paste comprising the frit powder and a binder can be formed, and applied to the surface of the heating element and/or the substrate surface subsequently by, e.g., screen printing, flow coating, spray coating, dip coating, brushing, and the like. Alternatively, the frit material can be deposited on the surface of the substrate or the spacing unit or on the surface of the heating element by thin film formation processes, such as chemical vapor deposition, sputtering, and the like. Many thin film processes can be used to form frit layers having a uniform thickness and width.

The spacing unit in the device of the present invention can be made of a glass material or a glass-ceramic material or a crystalline material. In certain embodiments, the spacing unit is made of glass material, such as a borosilicate glass with low CTE. Desirably, the material of the spacing unit has a CTE close to that of the substrate to which it is bonded and the frit material on its surface, such that thermal stress due to their CTE mismatch is reduced. The function of the spacing unit includes, inter alia: (i) increasing the physical distance between the substrates of the device, which is particularly desirable for large-size devices; and (ii) enhancing the strength of the sealed enclosure by providing a structural element in the seal between frit layers. The device of the present invention can have a single spacing unit, or multiple spacing unit each bonded to the surface of a substrate.

The spacing unit can be bonded to the surface of a substrate by a frit layer. The bonding can be effected by various means, such as heating in an oven or infrared light beam heating. Desirably, the substrate to be bonded with the spacing unit does not have optical or electrical elements built thereon sensitive to the heat needed to bond the spacing unit with the substrate. Alternatively, a spacing unit can be formed by, e.g., pressing a softened glass rod on the surface of the substrate to achieve a high-temperature fusion bonding. It is desired that the step of bonding the spacing unit to the substrate surface does not alter the desired physical properties of the substrate. Thus, in certain embodiments, it is desired that the bonding be carried out without subjecting the majority of the substrate surface to a temperature higher than its softening point. In certain embodiments, after bonding the spacing unit to the substrate surface, an anneal step is carried out to reduce the stress at the bonding interface.

Figure 4:
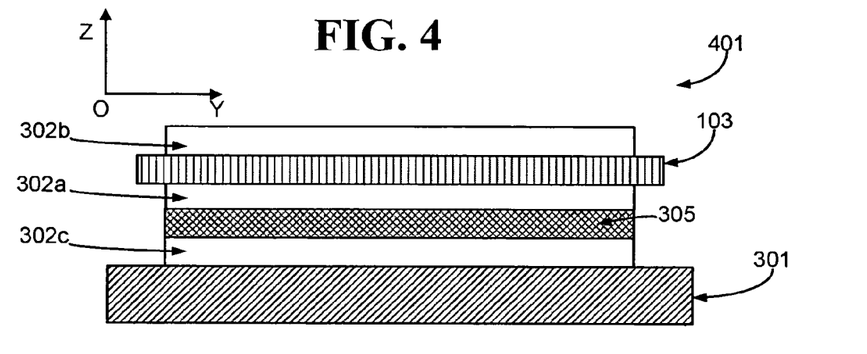
FIG. 4 is a schematic illustration of one embodiment of the device of the present invention comprising a resistive heating element and a spacing unit bonded to a substrate via a layer of frit material.

FIG. 4 schematically illustrates the side view of a device 401 according to one embodiment of the present invention. In this device, a metal resistive heating element 103, such as one made of Invar® or Kovar®, is bonded with a surface of a glass spacing unit 305 via a frit layer 302a, which, in turn, is bonded to a surface of substrate 301 via a frit layer 302c. The metal resistive heating element is covered with a layer of frit material 301a and 301b on each side, respectively. This substrate 301 can be the base substrate of an OLED device on which electronic components are constructed, or a cover glass substrate of an OLED device enclosure. The substrate 301 can be made of a glass, a glass-ceramic, crystalline or a composite material. Desirably, the bond between the substrate 301 and the spacing unit 305 is hermetic. Bonding between the heating element 103 and the spacing unit 305 can be effected by, e.g., passing an electric current through the heating element 103, or by heating the spacing unit and the heating element to a bonding temperature by other heating means such as infrared beam heating, oven heating (where the substrate desirably does not bear components sensitive to the heating), and the like. Device illustrated in FIG. 4 may be sold as is and shipped to an OLED display manufacture facility where another substrate having pre-fabricated electronics is attached thereto.

Figure 5:
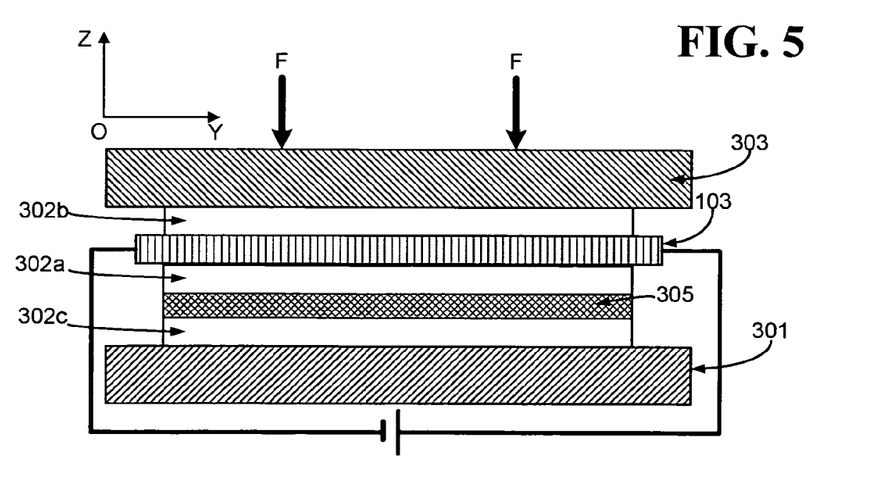
FIG. 5 is a schematic illustration of the device according to one embodiment of the present invention being sealed via resistive heating.

FIG. 5 illustrates schematically the bonding of the device 401 illustrated in FIG. 4 to another substrate 303. As mentioned above, the substrate 303 can bear functional components such as OLEDs thereon or can be a cover element without additional pre-formed component. Upon placing the substrate 303 over the layer of frit material 302b, and alignment of the two substrates, an electric current is allowed to pass through the resistive-heating element, whereby the frit material is heated and softened to flow between the heating element and the substrate surface. A bonding between the heating element and the spacing unit, desirably hermetic in certain embodiments, can be achieved at the same time, if it has not been formed in a previous step. Upon cooling, the frit hardens to establish a bond between the heating element and the substrate surface. In certain embodiments, it is desirable to apply an external force F to the substrate 303, such that a hermetic bonding can be effected between the substrate 303 and the heating element, and between the heating element and the spacing unit 305. The application of external force F to the substrate during sealing enables the frit to flow between the heating element and the surfaces to be bonded, leading to a more uniform thickness of the layers of frit materials in the final device. The application of the external force F also reduces the heating power needed to obtain the same degree of seal, reducing the likelihood of damage to nearby components sensitive to heat. It is desirable that the external force is applied directly to the area of the substrates being sealed, and that the force applied is substantially uniform. One approach to applying the external force is using a static weight above the upper substrate along the area being sealed.

It is also possible that a hermetically sealed device according to the present invention comprises more than one resistive heating element made from metal sheets. The metal sheets can be chosen to have differing CTE to match those of the adjacent layers of frit materials, spacing unit and substrate. For example, Invar® and Kovar® alloys with differing CTE can be purchased for these layers. Resistive heating elements made of these metals can be stacked and/or co-rolled to form the desired property and structure in the device. Bonding of the layers of differing resistive heating elements can be effected by, inter alia, frit, solder, and the like.

Figure 8:
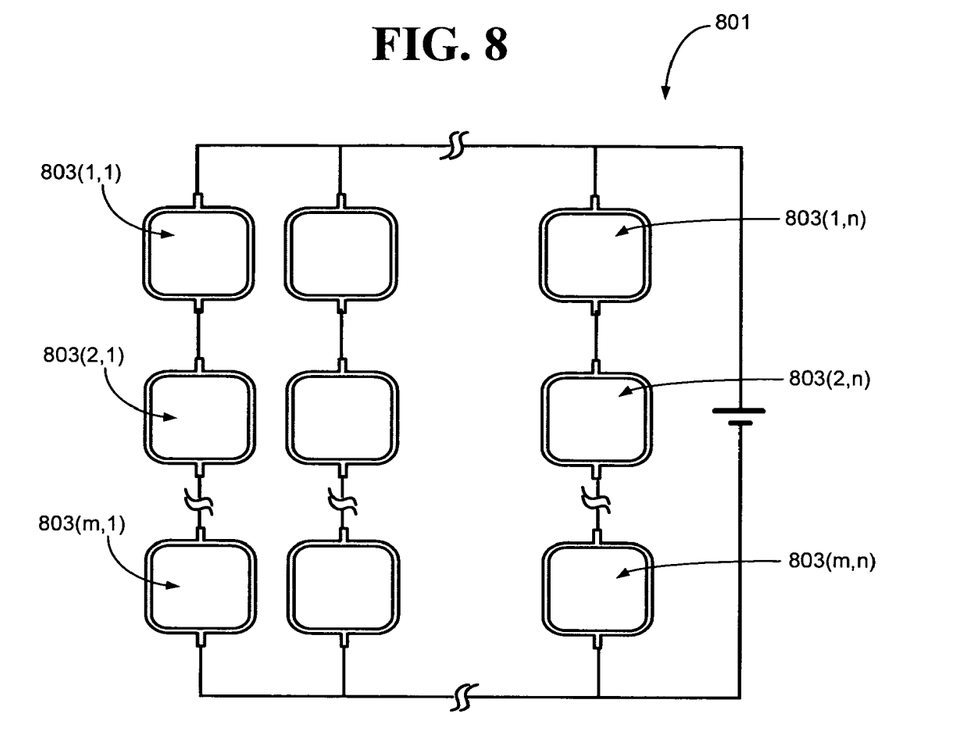
FIG. 8 is a schematic illustration of the electrical arrangements for sealing multiple devices of certain embodiments of the present invention simultaneously.

According to certain embodiments of the present invention, multiple devices of the present invention may be sealed at the same time by passing an electric current through the resistive-heating elements in them simultaneously. FIG. 8 schematically illustrates the electrical connection pattern 801 of a matrix of multiple devices (803(1,1), 803(1,2), ..., 803(1,n), ... 803(m, 1), 803(m,2), ..., 803(m,n)) being sealed simultaneously according to one embodiment of the present invention. Compared to radiation frit sealing, such as infrared beam sealing, this approach requires much less equipment, and can result in a much more uniform and reproducible heating among multiple devices being sealed.

During the sealing process, the temperature of the heating element and the substrate can be monitored by using, e.g., an infrared camera. The current applied to the heating element can be adjusted accordingly. If a hot spot is observed during the heating process, the dimension of the resistive heating element can be adjusted easily to achieve a more uniform heating. Thus, over-heating of the substrate and sensitive components built thereon can be avoided. On the other hand, a cold spot can be found and eliminated in substantially the same way.

Abrupt heating and cooling of a device or a part thereof can lead to crack in the frit layer and the substrate, possible debonding of the frit from the substrate and/or the heating element, and residual stress detrimental for the performance of the sealed device. To reduce the stress in the sealed area, frit sealed devices sometimes are required to be annealed upon sealing. In the present invention, such annealing can be very conveniently combined with the sealing step by reducing current. The current can be program-controlled to obtain the level of heating desired at differing stage of the heating, sealing and annealing process. Similar to the sealing step, the annealing step can be monitored using an infrared camera such that the temperature of the device and the most concerned area thereof (such as areas close to the heating element bearing sensitive electronic components) can be precisely controlled.

It should be noted that in the process according to the second aspect of the present invention, the steps are not necessarily carried out in the order they are laid out. For example, according to one embodiment of the third aspect, steps (C), (D) and (E) may be carried out sequentially (C)→(D)→(E). However, in certain embodiments, it is advantageous that the second layer of frit material of step (C) and the first layer of frit material of step (E) are applied to two opposite sides of the heating element first, and the heating element bearing the two layers of frit materials is then provided and placed over a surface of the first substrate, thereby completing steps (C), (D) and (E) simultaneously. In another embodiment, the second layer of frit material of step (C) is applied to a second side of the heating element first, and the heating element bearing the second layer of frit materials is then provided and placed over a surface of the first substrate, thereby completing steps (C) and (D) simultaneously. Thereafter, the first layer of frit material is applied to the first side opposite the second side of the heating element, which is distal to the first substrate, thereby completing step (E).

In certain embodiments of the second aspect of the present invention, the method comprises a step (D1) after step (D) and before step (F) as follows: (D1) bonding the heating element to the first substrate via the second layer of frit material. Such bonding can be effected by passing an electric current through the heating element, or by infrared light heating, or by placing the first substrate and the heating element and the second layer of frit material in an oven. In certain specific embodiments, step (E) was carried out prior to step (D1), i.e., the first layer of frit material is heated simultaneously with the heating element and the second layer of frit material in step (D1). In certain other specific embodiments, step (E) is carried out after step (D1), i.e., the first layer of frit material is applied after the heating element is bonded to the first substrate via the second layer of frit material.

Compared to direct resistive-heating sealing approached described in United States Patent Application Publication Serial No. 2007/0096631 and U.S. Pat. No. 7,282,393, the direct resistive-heating approach of the present invention where a closed-loop resistive heating element has the advantage of being capable of heating the frit material substantially uniformly without leaving a cold spot, leading to seal with higher quality, lower stress and substantially uniform stress distribution which is less prone to crack formation. Lab experiment indicated that the close-loop design could provide a uniform heating pattern around the frame of the heating element, while the open-loop design of United States Patent Application Publication Serial No. 2007/0096631 and U.S. Pat. No. 7,282,393 created a cold spot at the conjunction where the two leads were closely adjacent. This cold spot could cause a lack of sufficient melting of the frit, and consequently result in a weak link in the seal and eventually lead to frit cracking and possible delamination.

Due to the advantages of the devices comprising frit layers having multiple closed-loop frit lines as described supra, the third aspect of the present invention is directed to a hermetically sealed device comprising a spacing unit, a frit layer forming multiple closed loops of the frit material, and a resistive-heating element. While the resistive-heating element is not required to have a closed-loop structure because of the benefit provided by the multiple closed frit loops, it is advantageous that in certain embodiments the heating element has a closed-loop structure.

Compared to infrared irradiation sealing involving exposing the frit material (which must be infrared-absorbing) to an infrared light beam, certain embodiments the present invention have one or more of the following advantages.

Certain embodiments of the present invention are capable of providing a much simpler process and better quality control. Infrared irradiation sealing requires the formation and dispensing of the frit in the form of a paste to form the frit line. Frit paste preparation, dispensing, and sintering processes are fairly complicated because many steps and variables are involved, which affects the consistency of frit quality. Irradiation energy absorption can be affected by many factors such as glass particle sizes, porosities, geometry of the frit, surface condition under the frit, light beam shape and size, traveling speed, etc. In contrast, sputtering deposition of frit material (a capability of the present invention) and integrated resistive heating processes are much simpler. Frit can be deposited directly from bulk glass (target), which eliminates ball milling, filler phase, organic vehicle, viscosity issue, sintering, etc. Frit will be melted by conducting heat from resistor, which is simpler, easier to operate, and much more uniform than laser heating.

Certain embodiments of the present invention provides better CTE match with glass. Frit usually has higher CTE value than the cover and substrate glasses. This mismatch can cause thermal stress and cracking in either frit or glass or both if the frit material is the only media between the substrates. Although filler materials can be included in the frit to adjust the CTE, this approach is not the most effective way for two reasons. First, when the filler is not evenly dispersed in frit, CTE would vary from one location to another in the frit, causing stress in the sealed device. Second, the critical CTE mismatch is present at the interface between the frit and the substrate, while the filler is in the body of frit, so the CTE-adjustment can be insufficient. With sputtering deposition technology, the resistor and frit can be built layer-by-layer with gradual CTE changes, so the CTE matches each other in a more effective way. Better CTE match means less risk of frit cracking.

Certain embodiments of the present invention provide optimized frit quality and uniformity. Frit quality is evaluated by uniformity in width & thickness, surface smoothness, cross-section profile, etc. In frit paste dispersion process utilized in infrared beam sealing method, the frit cross-section is always in water-bead shape because of surface tension force, and the width and thickness always fluctuate. In addition, because of scattered glass particle sizes, "high spots" are often found on the frit surface, which can cause poor contact or cracking during sealing. With sputtering deposition according to certain embodiments of the present invention, the frit can be deposited in precise dimensions (width & thickness) and squared profile, so it can provide better surface contact and larger sealable area.

Certain embodiments of the present invention provide much lower porosity in the frit seal. Porosity is considered as defective microstructure in infrared beam sealed frit because porosity interferes with light beam and alters laser energy absorption. Also porosity lowers strength and bond of frit. Excessive porosity may affect hermeticity of frit seal. Unfortunately, porosity intrinsically associates with frit paste and sintering process. In contrast, sputtering deposition technique can provide much denser frit and solve the porosity issue.

The present invention enables a sealed frit loop without start-stop point. Infrared light beam frit sealing involves the start/stop point in the paste dispensing step and the light exposure step. Those start-stop points can be weak points in the final seal. Irradiation start/stop points are typically heated twice during the sealing process, which may sock the frit and open micro-cracks. By using closed-loop direct resistive heating, the frit line can be heated substantially evenly. Furthermore, in certain embodiments where sputtering deposition of frit is employed, the frit line can be formed to have a substantially uniform thickness before it is heated to bond the heating element with the substrates.

Certain embodiments of the present invention enable the use of a thinner frit line than would be required by infrared light beam exposure approach. There are a number of advantages to go with thinner frit. First of all, thinner frit needs less energy to melt, so the risk of heat damage on metal leads is less. This is very valuable for widening the process window. Second, thinner frit improves mechanical performance of the seal because thinner joint is stronger and more flexible than bulky joint. This is significant for competing with epoxy seal because brittleness and lack of flexibility have been the major disadvantages of frit seal vs. epoxy seal. Third, thinner frit reduces thermal expansion/contraction, thus reduces residual stress. Residual stress is considered to be the driving force to cause frit cracking and failure in delayed manner in current process. Thinner frit (<2 microns) can easily be achievable by sputtering deposition, but difficult for current frit paste dispensing. Thinner frit also can easily be melted by resistive heating system but difficult for infrared light beam, because light energy absorption decreases with decreasing frit thickness.

As discussed supra, the temperature of the heating element used in the present invention can be easily measured and controlled via the use of various means, such as infrared imaging. The temperature of the frit when using infrared light beam exposure is not directly measurable, adding to the difficulty of process control. With resistive heating method, the resistor temperature can be measured by various techniques, such as infrared imaging. Therefore, the temperature can be easily adjusted for the needs of differing heating elements, differing frit materials, differing substrate materials, and differing devices for differing applications.

Many devices can be sealed according various embodiments of the present invention. As mentioned supra, the process parameters of the present invention can be fined tuned to suit the needs of differing materials and applications. On the other hand, the same heating element, same frit material, and the same geometry of the direct resistive heating system according to the present invention can be applied to the sealing of many devices without the need of significant alteration, contrary to the window testing required of infrared light beam heating approach.

As mentioned supra, both the heating and cooling rate of the heating element during the sealing process of the present invention can be precisely controlled by using a programmed current source to provide the needed heating power. This could eliminate the need of a separate annealing in an annealing oven. It is difficult for infrared light heating to achieve such high degree of control.

Fast sealing can be achieved by using the present invention. The sealing of even a large device with a long frit line can be achieved within a short period of time as long as sufficient current is supplied. Infrared light scanning method would take significantly longer time proportionate to the overall length of the frit line at a given scanning rate.

The following non-limiting examples further illustrate the present invention.

EXAMPLES

Examples without including a spacing unit in the device were made as follows:

Thin sheets of Kovar® or Invar® alloy, 2 to 5 mils (0.05 to 0.13 mm) thick, were purchased from commercial suppliers such as Ed Fagan Inc. Designed heating element patterns were cut from the sheets by either photochemical etching or micro-laser cutting method. Photochemical etching is suitable for very precise, burr-free, and large quantity cutting. The patterns are pre-oxidized at about 550° C. for about 2 to 5 minutes; Pattern can be held by a magnetic plate (as a tool fixture), because both Kovar® and Invar® are soft magnets. Frit was dispensed on one side of the pattern by either screen-printing or hydraulic method, followed by pre-curing. Masking is required in screen-printing case. Frit is dispensed on the other side of the pattern by either screen-printing or hydraulic method, followed by pre-curing. Masking is required in screen-printing case. The double-fritted heating element was sandwiched between two pieces of glass substrates with a proper alignment. Top weight, about 100 to 150 grams per square mm of frit, is applied on the cover glass. The heating element is connected to either a DC or AC power supply that is computer programmable for controlling the cooling rate. The power is turned on with specified current to heat the element to specified temperature for specified duration, depending on the actual frit being used. For experimented frit, the parameters were 8 amps and 600±50° C. for 2 to 5 seconds. The electric power is turned off in a specified rate, which should result in a cooling rate about 100° C. per minute. The sealed OLED devices are inspected for quality and defects.

In an example according to the present invention, a metal heating element having the shape illustrated in FIG. 1 with a uniform thickness and uniform width was made and sealed between two glass substrates as illustrated in FIG. 4. Substantially uniform heating temperature was achieved during the sealing process.

Figure 6:
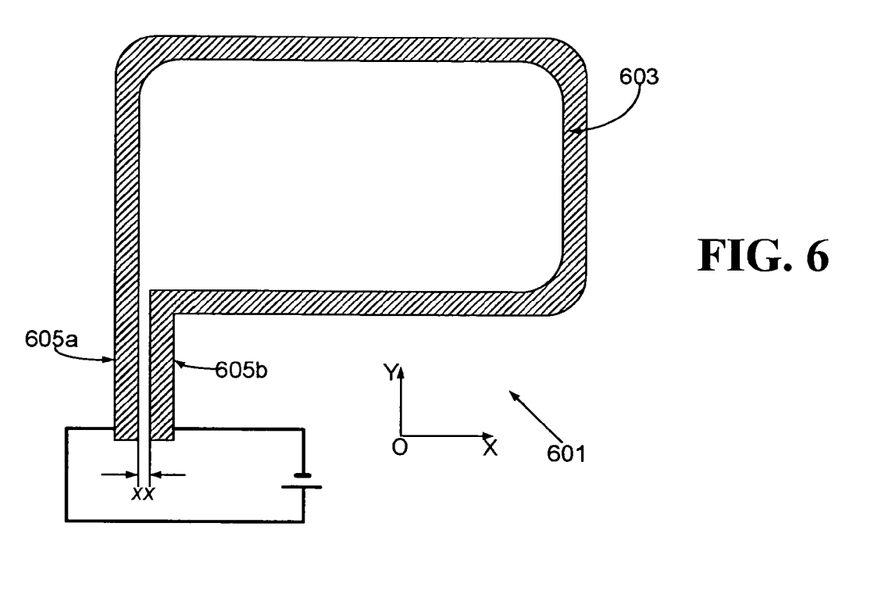
FIG. 6 is a schematic illustration of the structure of a resistive heating element having an open-loop structure.
Figure 7:
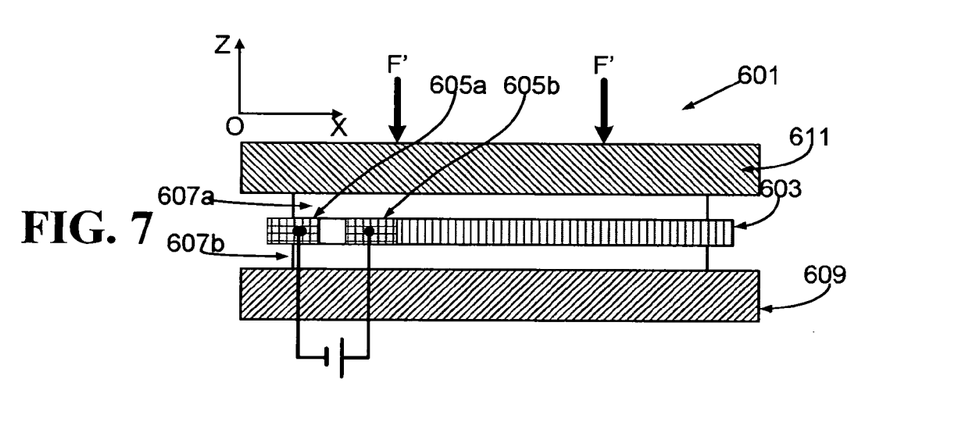
FIG. 7 is a schematic illustration of the resistive heating element of FIG. 6 being heated electrically to seal a device.

In a comparative example, a metal heating element 601 having a shape illustrated in FIG. 6 and covered with a layer of frit material (607a and 607b in FIG. 7) on each side, respectively, was made and heated between two glass substrates 609 and 611 as illustrated in FIG. 7. The metal heating element comprised a body 603 forming an open-loop and having two electrical lead ends 605a and 605b having a gap xx of 0.2 mm. An infrared camera was used to observe the heating process and monitor the temperature of the heating element during heating. A cold spot was observed between the gap of the two lead ends 605a and 605b during sealing.

It is expected that a similar device with a glass spacing ring interposed between the heating element and a substrate can be made by bonding the spacing ring to the substrate surface before bonding the heating element.

It will be apparent to those skilled in the art that various modifications and alterations can be made to the present invention without departing from the scope and spirit of the invention. Thus, it is intended that the present invention cover the modifications and variations of this invention provided they come within the scope of the appended claims and their equivalents.

What is claimed is:

1. A device comprising:

(I) a first substrate;

(II) a closed-loop-shaped inorganic spacing unit hermetically bonded to the first substrate;

(III) a resistive-heating element hermetically bonded to the spacing unit, the resistive-heating element having a shape substantially corresponding to the spacing unit; and (IV) a first layer of frit material bonded to the resistive-heating element over the surface of the resistive-heating element farther from the first substrate, the first layer of frit material forming multiple closed loops.

2. A device according to claim 1, wherein the resistive-heating element has an electrically closed-loop structure.

3. A device, comprising:

a first substrate;

a closed-loop-substrate inorganic spacing unit hermetically bonded to the first substrate;

a resistive-heating element having an electrically closed-loop structure hermetically bonded to the spacing unit, the resistive-heating element having a shape substantially corresponding to the spacing unit; and a first layer of frit material bonded to the resistive-heating element over the surface of the resistive-heating element farther from the first substrate, wherein the first layer of frit material forms multiple closed loops.

4. A device according to claim 3, further comprising: a second substrate bonded to the first layer of frit material.

5. A device according to claim 4, wherein between the first substrate and the second substrate, a hermetically sealed enclosure is defined.

6. A device according to claim 5, wherein the stress of the bonding between the first layer of frit material and the second substrate is substantially uniform.

7. A device according to claim 3, wherein the resistive heating element has an average thickness from 0.025 to 2.5 mm.

8. A device according to claim a 3, wherein the resistive heating element has a substantially uniform thickness and width.

9. A device according to claim 3, further comprising: a second layer of frit material between the first substrate and the spacing unit.

10. A device according to claim a 3, wherein the resistive heating element comprises a metal selected from a Ni—Fe alloy, a Ni—Co—Fe alloy and combinations thereof.

11. A device according to claim 3, wherein the resistive heating element comprises electrical leads arranged such that when an electrical potential gradient is applied to the leads, the current density passing through the loop is substantially uniform.

12. A device according to claim 9, wherein the first layer of frit material has an average thickness of 0.005 to 0.5 mm; and the second layer of frit material has an average thickness of 0.005 to 0.5 mm.

* * * * *